(12) United States Patent
Post et al.

(10) Patent No.: US 7,804,192 B2
(45) Date of Patent: Sep. 28, 2010

(54) HIGH-FREQUENCY SIGNAL COUPLING DEVICE

(75) Inventors: Georg Post, La Ville du Bois (FR); Chafik Meliani, Berlin (DE)

(73) Assignee: Alcatel Lucent, Paris (FR)

( * ) Notice: Subject to any disclaimer, the term of this patent is extended or adjusted under 35 U.S.C. 154(b) by 729 days.

(21) Appl. No.: 11/675,627

(22) Filed: Feb. 15, 2007

(65) Prior Publication Data
US 2007/0205845 A1 Sep. 6, 2007

(30) Foreign Application Priority Data
Feb. 20, 2006 (FR) .................................. 06 50577

(51) Int. Cl.
*H02J 1/10* (2006.01)
(52) U.S. Cl. ....................................................... 307/43
(58) Field of Classification Search ................... 307/43
See application file for complete search history.

(56) References Cited

U.S. PATENT DOCUMENTS

| 5,365,197 | A | 11/1994 | Ikalainen |
| 5,550,513 | A | 8/1996 | Wong |
| 6,094,099 | A | 7/2000 | Kobayashi |
| 6,377,125 | B1 | 4/2002 | Pavio |

OTHER PUBLICATIONS

Thomas Y. K. Wong et al, "A 10 Gb/S AlGaAs/GaSs HBT High Power Fully Differential Limiting Distributed Amplifier for III-V Mach-Zehnder Modulator", IEEE Journal of Solid-State Circuits, IEEE Service Center, Piscataway, NJ, US, vol. 31, No. 10, Oct. 1996 XP011060351.

*Primary Examiner*—Fritz M Fleming
*Assistant Examiner*—Dru M Parries
(74) *Attorney, Agent, or Firm*—Harness, Dickey & Pierce, P.L.C.

(57) ABSTRACT

A device for coupling high-frequency signals between a first component and a second component is adapted to supply a first bias voltage-current pair to the first component and a second bias voltage-current pair to the second component.

11 Claims, 1 Drawing Sheet

HIGH-FREQUENCY SIGNAL COUPLING DEVICE

CROSS-REFERENCE TO RELATED APPLICATIONS

This application is based on French Patent Application No. 0650577 filed Feb. 20, 2006, the disclosure of which is hereby incorporated by reference thereto in its entirety, and the priority of which is hereby claimed under 35 U.S.C. §119.

BACKGROUND OF THE INVENTION

Field of the Invention

The present invention concerns a device for coupling high-frequency signals between two opto-electronic components fed with separate bias currents and voltages.

A wideband ($\geq$40 Gbit/s) modulator, such as a Mach-Zender modulator used in an opto-electronic system, operates with a controlled peak-to-peak voltage, for example of 6 V in the case of a lithium-niobate modulator, superimposed on a DC bias. It is moreover often beneficial to use an amplifier to supply the input signal of the modulator.

The amplifiers and modulators are generally fed with separate currents and voltages. Moreover, integrating a modulator and an amplifier in the same component causes coupling problems because of their different DC bias. An intermediate coupling device is therefore necessary.

It is then beneficial to minimize microwave (>100 kHz) losses in the coupling device, namely in the transmission lines transmitting the signal between the amplifier and the modulator. These losses are caused by electromagnetic reflection of the signal as a result of spurious microwave impedances and capacitances. If the signal to be transferred is a high-frequency (>100 kHz) signal, it is then necessary to match the impedance of the coupling device to those of the amplifier and the modulator.

The coupling device may be a laboratory "bias T". It therefore comprises a capacitance and an impedance. The volume of such a device prevents integration into a monolithic microwave integrated circuit (MMIC), however. Moreover, a "bias T" generally has a narrow bandwidth; it passes neither low frequencies (below 100 kHz) nor high frequencies (above a few GHz). Moreover, it is very bulky, and so cannot be used in integrated circuits.

The coupling device may equally be a simple offset diode, i.e. a discrete semiconductor diode. The diode has a constant voltage drop but a junction resistance and a capacitance that limit the bandwidth. With such a device, transmission is not identical at high and low frequencies. This device can be optimized for only one or the other of these frequency ranges, and in both cases induces considerable losses, caused by imperfect source and load impedance matching, thus reducing performance.

The coupling device may equally be a simple coupling capacitor. Such a device causes reflection losses, however, and therefore bandwidth limitation.

Moreover, the use of a small capacitor such as could be integrated into an MMIC means that frequencies below 100 kHz cannot be transmitted.

The coupling devices cited above are called passive, i.e. non-energized. They do not pass all the high frequencies required in modulators, for example opto-electronic modulators. Thus frequencies between a few kHz and a few tens of GHz are blocked. These passive devices are also too bulky, especially if they include impedances. They cannot then be integrated into an MMIC, for example.

Patent application EP-A-1 271 767 discloses distributed active charges for biasing an amplifier for the input signal of a modulator. However, such a device offers unidirectional coupling, i.e. only the output of the amplifier is energized. The modulator must be biased by an independent device. Moreover, the device described in the above document can supply only a positive current, and not a current that can be either positive or negative. What is more, the device described in EP-A-1 271 767 comprises an output resistance the function whereof is to absorb high-frequency components of the contrapropagating signal but which induces losses in the signals transmitted.

There is therefore a need for a bidirectional coupling device, i.e. a coupling device able to transmit a signal from a first component to a second and vice versa without modifying the structure of the device. There is also a requirement for a coupling device with a high bandwidth, namely from a few kHz to 40 GHz. This device must moreover have a dimension enabling it to be integrated into an MMIC. Finally, it must be as universal as possible by enabling input and output coupling of any voltage-current pair required by the user.

SUMMARY OF THE INVENTION

The invention therefore proposes a device for coupling a high-frequency signals between a first component and a second component adapted to supply a first bias voltage-current pair to the first component and a second bias voltage-current pair to the second component.

The invention also proposes such a coupling device comprising first and second transmission lines, a plurality of voltage limiters connected to the first and second transmission lines and distributed along the transmission lines, a first plurality of current limiters connected to a first supply voltage port and to the first transmission line and distributed along the first transmission line, and a second plurality of current limiters connected to a second supply voltage port and to the second transmission line and distributed along the second transmission line.

The invention may also have one or more of the following features:
- a current limiter comprises a diode,
- a current limiter comprises a current mirror,
- a current limiter comprises a transistor,
- a voltage limiter comprises a diode,
- a component is electronic,
- a component is opto-electronic,
- the first and second transmission lines are coupled to each other in a capacitive manner,
- the coupling device according to the invention is adapted to be integrated into the first component or the second component.

Other features and advantages of the invention will become apparent on reading the following detailed description of embodiments of the invention given by way of example only and with reference to the drawings.

DETAILED DESCRIPTION OF THE PREFERRED EMBODIMENT

The invention proposes a coupling device 1 for coupling high-frequency signals between a first component 3 and a second component 5. At the time of transmission of a high-frequency signal between these components 3, 5, this coupling device 1 can supply a first DC bias voltage-current pair (Ve, Ie) to the first component 3. This coupling device 1 can also supply a second DC bias voltage voltage-current pair (Vs, Is) to the second component 5. Accordingly, at the time of transmission of such a signal, the coupling device 1 can supply a voltage Ve and an operating current Ie specific to a first component 3. Similarly, this coupling device 1 can also supply a voltage Vs and a current Is specific to the second component 5. These required voltages or currents Ve, Ie, Vs, Is can be of any kind, i.e. positive or negative, DC or AC. This facility for choosing the voltages Ve, Ie, Vs, Is supplied makes the order of the components 3, 5 at the input and at the output of the coupling device 1 unimportant. The coupling device 1 according to the invention is therefore bidirectional with regard to the propagation of the high-frequency signal.

Figure 1:
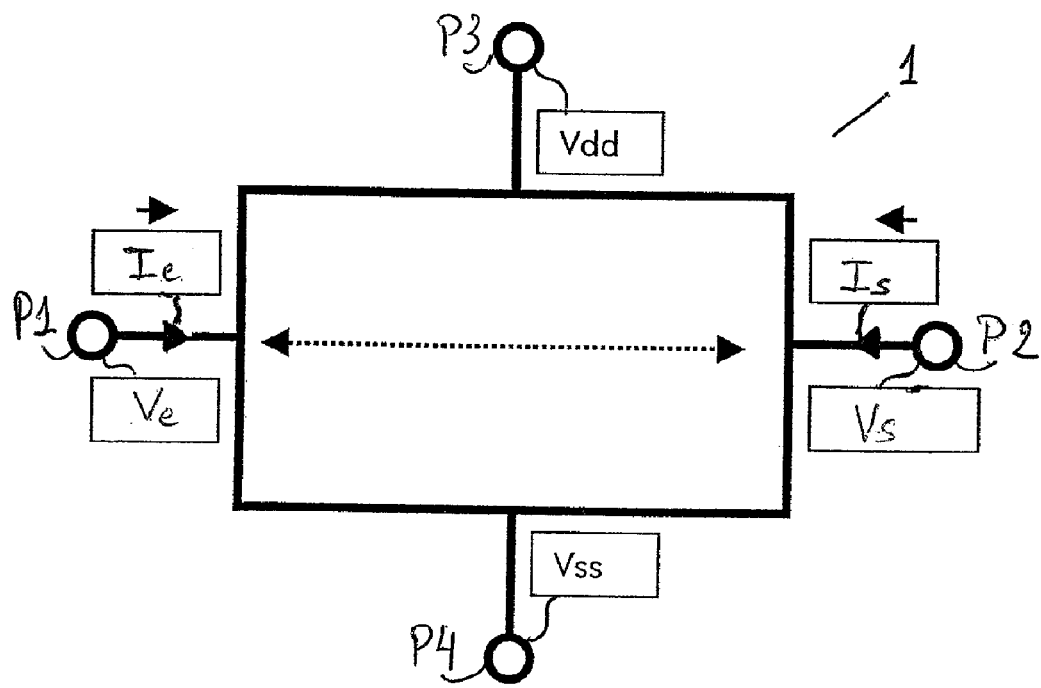
FIG. 1 is a functional schematic of the coupling device 1 according to the invention.

FIG. 1 is a functional schematic of the coupling device 1 according to the invention. The coupling device 1 comprises an input port P1 and an output port P2. The port P1, respectively P2, has an input voltage Ve and an input current Ie, respectively an output voltage Vs and an output current Is. The coupled components 3, 5 (not represented in FIG. 1) are connected to the input port P1 and the output port P2. The coupling device 1 can therefore function in both possible signal propagation directions, i.e. from the port P1 to the port P2 and vice versa. The coupling device 1 is fed via its first supply voltage port P3 with a first DC voltage Vdd and via its second supply voltage port P4 with a second DC voltage Vss. At high frequencies these ports P3 and P4 are connected to the potential of a ground plane.

The following general concepts are used in the following explanation to estimate the numbers and the dimensions of the various components of the device.

A lossless transmission line is a wire, ribbon or other electrical conductor characterized by an inductance L per unit length and a capacitance C per unit length relative to a ground plane.

The characteristic impedance Z of this lossless transmission line is defined by $Z^2=L/C$. This characteristic impedance corresponds to the resistance value to be connected to the end of the line enabling any electrical signal propagating on the line to be received without losses or reflections.

If the transmission line is not continuous but rather a discontinuous sequence of individual inductors of inductance L (and of small size compared to the total length) and individual capacitors of capacitance C, connected to ground, then the structure is called an artificial transmission line.

That line has the same electromagnetic propagation properties as the equivalent continuous line, in particular the same impedance Z given by $Z^2=L/C$, provided that there is an upper limit on the frequencies f of the signals, according to the formula $(2\pi f)^2 L C < 1$. Accordingly, the greater the number and the smaller the size—and therefore the lower the value—of the individual inductors of inductance L and the individual capacitors of capacitance C, the higher the upper operating frequency. The above formula and technical knowledge of microfabricated devices enable the geometrical dimensions necessary for achieving a required upper operating frequency to be estimated.

Figure 2:
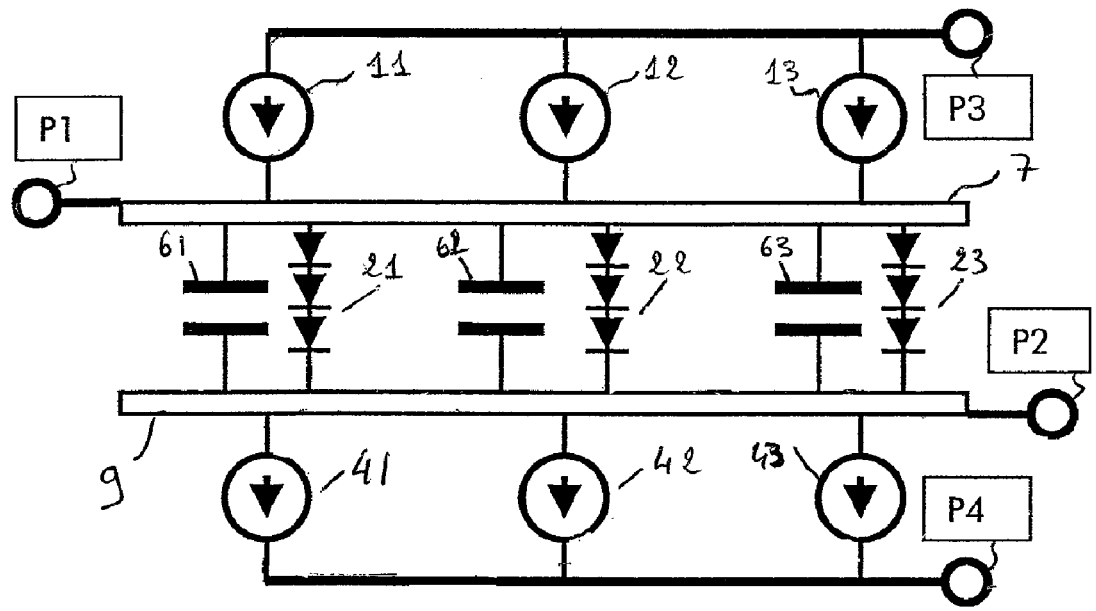
FIG. 2 is a semi-functional schematic of the coupling device 1 according to the invention.

FIG. 2 is a semi-functional schematic of the coupling device 1 according to the invention. The coupling device 1 comprises first and second power supply ports P3 and P4. The coupling device 1 also comprises a first transmission line 7 at the input end of which is the input port P1. The coupling device 1 also comprises a second transmission line 9 at the output end of which is the output port P2.

The first and second transmission lines 7, 9 are biased differently and are linked by voltage limiters 21, 22, 23 connected between the two lines 7, 9. The voltage limiters 21, 22, 23 therefore create a voltage drop. Accordingly, once one of the two transmission line voltages is fixed, the voltage of the second transmission line can be chosen by varying the voltage limiters 21, 22, 23.

The voltage limiters 21, 22, 23 are distributed, i.e. regularly spread out, along the two transmission lines 7, 9 in order to avoid any loss during the transmission of a high-frequency signal. Coupling capacitors 61, 62, 63 are also disposed at regular intervals between the two lines. In fact, in operation at high frequencies, isolated circuit elements (grounded capacitors associated with the voltage limiters 21, 22, 23 or with the coupling capacitors 61, 62, 63) between the two transmission lines 7, 9 create losses through electromagnetic reflection of the transmitted high-frequency signal. These unwanted impedances and capacitances are less apparent when these elements are distributed in large numbers such that their electrical values L and C satisfy the formula referred to hereinabove at the operating frequency f. These unwanted impedances and capacitances are also less apparent when the characteristic impedance of the system formed by the two transmission lines 7, 9 and the voltage limiters 21, 22, 23, taking into account the reactances of the distributed elements, is equal to that of the transmission cable at 30 the input of the coupling device 1. These unwanted impedances and capacitances are also less apparent if the characteristic impedance of the system formed by the two transmission lines 7, 9 and the voltage limiters 21, 22, 23, taking into account the reactances of the distributed elements, is equal to that of the transmission cable at the output of the coupling device 1. The formula $Z^2=L/C$ for the impedance Z referred to hereinabove enables the respective elements to be rated in order to equalize the impedances of the input and output transmission cables. This equality of their impedances guarantees no reflection of the transmitted signal. The input transmission cable corresponds to the wire connecting the first component 3 to the coupling device 1. The output transmission cable corresponds to the wire connecting the second component 5 to the coupling device 1.

The voltage limiters 21, 22, 23 are distributed in parallel along the two transmission lines 7, 9. There are many small voltage limiters 21, 22, 23 in order to have a cut-off frequency higher than the maximum frequency of the signal to be transmitted. As explained hereinabove, the number and size of these voltage limiters 21, 22, 23 are determined by the formula $(2\pi f)^2 L C < 1$. If this were not the case, the component of the signal above the cut-off frequency would not be transmitted, because of the electromagnetic reflection.

It is the high cut-off frequency f required for the coupling device 1 (typically a few tens of GHz) that fixes the number of voltage limiters 21, 22, 23 used, so that the values L of the individual inductors of inductance L and C of the individual capacitors of capacitance C for each voltage limiter 21, 22, 23 conform to the formula $(2\pi f)^2 L C < 1$. The size in the sense of the total active section of the voltage limiters 21, 22, 23 is fixed by the low cut-off frequency (a few tens of kHz or even 0 Hz). For example, if a low frequency of 10 kHz is sufficient, it suffices to choose small voltage limiters 21, 22, 23 with a relatively high spurious series resistance. In fact, at high frequencies, these spurious series resistances are short-circuited by the coupling capacitors 61, 62, 63. To achieve a very low frequency, it is necessary to increase the size or the number of voltage limiters 21, 22, 23 in order to minimize the effect of these spurious series resistances, and therefore to minimize the losses that they induce. The characteristic impedance is calculated in the same way as for an artificial transmission line formed of a string of inductors and capacitors, that artificial transmission line consisting of the shunt capacitances of the voltage limiters 21, 22, 23 and the series inductances of the transmission lines 7, 9 that connect them.

FIG. 2 also shows first current limiters 11, 12, 13 between the first power supply port P3 of the coupling device 1 and the first transmission line 7. These first current limiters 11, 12, 13 have their parameters set to feed the voltage limiters 21, 22, 23 with a current enabling them to operate as required, i.e. to produce the required voltage drop. These first current limiters 11, 12, 13 also have their parameters set to supply a required input current Ie to the input port P1.

These first current limiters 11, 12, 13 are regularly distributed in order to limit the losses caused by the appearance of isolated spurious capacitances, resistances and impedances at high frequencies. FIG. 2 shows three of these first current limiters 11, 12, 13. Their number depends on the required high cut-off frequency, which, as explained hereinabove, is calculated from the formula $(2\pi f)^2 L\,C < 1$. This required high cut-off frequency f is a decreasing function of the capacitance C of the individual capacitors of each voltage limiter 21, 22, 23 and of the inductance L of the individual inductors of the line sections between the elements.

Similarly, second current limiters 41, 42, 43 are placed between the second transmission line 9 and the second power supply port P4. These second current limiters 41, 42, 43 have their parameters set to absorb the current coming from the voltage limiters 21, 22, 23. These second current limiters 41, 42, 43 also have their parameters set in order to supply a wanted output current Is at the output port P2.

These second current limiters 41, 42, 43 are also regularly distributed in order to limit losses caused by the appearance of spurious capacitances, resistances and impedances at high and low frequencies. These second current limiters 41, 42, 43 therefore retain a constant wideband transmission coefficient (ratio of output amplitude to input amplitude). FIG. 2 shows tree second current limiters 41, 42, 43. Their number depends on the high cut-off frequency required, as in the case of the current limiters 11, 12 and 13 referred to hereinabove.

The first current limiters 11, 12, 13 and likewise the second current limiters 41, 42, 43 may be transistors. These transistors supply constant currents independently of the voltage of the transmission line (7 or 9) to which they are connected. These transistors therefore enable adjustment of the constant current passing through them, even after installation. Either a bipolar transistor or a field-effect transistor may be used, as a function of the technology of the microelectronic circuit into which the coupling device is to be integrated.

The first current limiters 11, 12, 13 and likewise the second current limiters 41, 42, 43 may also be diodes with their parameters set for a constant current. Diodes are simpler to install than transistors. Diodes do not allow the current passing through them to be adjusted after installation. All that is possible is to replace one diode by another having the required operating current.

The first current limiters 11, 12, 13 and likewise the second current limiters 41, 42, 43 may furthermore be limiter resistors. Such limiter resistors ensure current limitation from a specific voltage. Moreover, limiter resistors are simple to install. However, limiter resistors do not allow the current passing through them to be adjusted after installation.

With regard to the current limiters 11, 12, 13, 41, 42, 43, it is also possible to use an HBT (heterojunction bipolar transistor) technology thanks to current mirror circuits. Current mirror circuits enable the production of adjustable current limiters, the control signals whereof are well decoupled from the high-frequency signals transmitted.

A voltage limiter 21, 22, 23 may comprise a diode. The diode creates the required voltage drop between the two transmission lines 7, 9. The type of diode varies according to the microelectronic technology. The diode preferably operates at a bias such that its differential resistance is low. For example, a pn diode implies a higher voltage on the first transmission line 7 than on the second transmission line 9. This is avoided by using a Zener diode, which enables the device to operate bidirectionally since the input voltage Ve and the output voltage Vs can be higher than one another according to the energization current of the Zener diodes.

It is also possible to use a number of diodes in series for a voltage limiter 21, 22, 23. This produces a greater voltage drop for the same operating current of the voltage limiter. Moreover, because a diode has a fixed junction voltage on completion of its fabrication, the total voltage drop depends on the number of diodes in series.

FIG. 2 also shows coupling capacitors 61, 62, 63 in parallel with the voltage limiters 21, 22, 23. Each of these capacitors 61, 62, 63 limits high-frequency losses. The DC component of the current passes through the voltage limiters 21, 22, 23 and the high-frequency component passes through the coupling capacitor 61, 62, 63. Accordingly, at high frequencies, the impact of any spurious resistance that may have appeared in series with a voltage limiter 21, 22, 23 and caused losses is limited by the shunt coupling capacitor 61, 62, 63. In fact the coupling capacitor 61, 62, 63 absorbs the high-frequency component of the current.

These coupling capacitors 61, 62, 63 are distributed along the transmission lines 7, 9. The number and value of the coupling capacitors 61, 62, 63 are fixed by the high and low cut-off frequencies required for the device. As explained hereinabove, the high cut-off frequency is derived from the formula $(2\pi f)^2 L\,C < 1$. The low cut-off frequency depends on the series resistance of the parallel combination of the voltage limiters 21, 22, 23. The low cut-off frequency is close to zero if a suitable technology is used to reduce this resistance to a value much lower than the characteristic impedances.

Accordingly, the transmission lines 7 and 9 are coupled with a low characteristic impedance, provided that the voltage limiters 21, 22, 23 are combined with capacitors between the transmission lines 7 and 9. Consequently, the characteristic impedances relative to the ports P1 and P2 are substantially equal and are determined by the inductance per unit length of all of the lines and by the capacitance per unit length of all of the current limiters 11, 12, 13, . . . , 41, 42, 43, . . .

All of these components used for the voltage limiters 21, 22, 23 and the current limiters, 11, 12, 13, 41, 42, 43 have dimensions of the order of one square micrometer. In particular no inductances are used, the dimensions whereof are often greater than those of other components. Integrated fabrication of the coupling device 1 is therefore possible. It may therefore be integrated into an MMIC.

This coupling device 1 may furthermore be integrated into the first or second component 3, 5. It is advantageous to be able to choose whichever of the two has the more appropriate materials and technologies.

The coupling device 1 may be used to couple an amplifier and a modulator, but also any other electronic or opto-electronic component. This may be a Mach-Zender modulator, or even any component using a microwave signal (any frequency above 1 GHz). Two amplifiers can therefore be coupled by the present coupling device 1. This coupling is facilitated by the possibility of choosing pairs of input and output voltages and currents Ve, Ie, Vs, Is of the coupling device 1 and thereby the characteristic impedance of the coupling device 1.

The coupling device 1 may be fabricated using high-speed III-V HEMT (high electron mobility transistor) technologies on semi-insulator substrates, or any other technology with coplanar transmission lines 7, 9. Here the coplanar lines are side-by-side and not one on top of the other. Thus no interconnecting hole through a semi-insulative substrate is required. This avoids drilling through the substrate to connect circuit elements to a neutral voltage.

The two transmission lines 7, 9 may be fabricated in the form of coupled lines, one above the other and separated by a thin layer of insulation, such as silicon nitride.

The coupling device 1 of the present invention can transfer both low-frequency signals and high-frequency signals, i.e. both a DC signal and signals at frequencies above 100 MHz. The coupling device 1 effects this transfer without losses and with the advantages listed hereinabove, as well even as any that may suggest themselves clearly and unambiguously to the person skilled in the art in the light of the present application.

There is claimed:

1. A device for coupling high-frequency signals comprising:
   ports between a first component and a second component, such that the device is configured to supply a first bias voltage current pair to the first component, and a second bias voltage current pair to the second component;
   a first and a second transmission line;
   a first plurality of current limiters connected to a first supply voltage port; and
   a second plurality of current limiters (i) connected to a second supply voltage port and (ii) being distributed along the second transmission line.

2. The device according to claim 1, wherein the first plurality of current limiters is connected to said first transmission line and distributed along said first transmission line.

3. The device according to claim 2, wherein a current limiter comprises a diode.

4. The device according to claim 2, wherein a current limiter comprises a current mirror.

5. The device according to claim 2, wherein a current limiter comprises a transistor.

6. The device according to claim 1, further comprising:
   a plurality of voltage limiters connected to the first and second transmission lines and distributed along said transmission lines.

7. The device according to claim 6, wherein a voltage limiter comprises a diode.

8. The device according to claim 1, wherein a component is electronic.

9. The device according to claim 1, wherein a component is opto-electronic.

10. The device according to claim 1, wherein the first and second transmission lines are coupled to each other in a capacitive manner.

11. The device according to claim 1, wherein the coupling device is adapted to be integrated into said first component or said second component.

* * * * *